US010692694B2

(12) United States Patent
Gledhill et al.

(10) Patent No.: US 10,692,694 B2
(45) Date of Patent: Jun. 23, 2020

(54) METHOD AND APPARATUS FOR ENHANCING SE DETECTION IN MIRROR-BASED LIGHT IMAGING CHARGED PARTICLE MICROSCOPES

(71) Applicants: Galen Gledhill, Hillsboro, OR (US); Mostafa Maazouz, Hillsboro, OR (US)

(72) Inventors: Galen Gledhill, Hillsboro, OR (US); Mostafa Maazouz, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/229,936

(22) Filed: Dec. 21, 2018

(65) Prior Publication Data
US 2019/0198289 A1 Jun. 27, 2019

Related U.S. Application Data

(60) Provisional application No. 62/610,822, filed on Dec. 27, 2017.

(51) Int. Cl.
*H01J 37/00* (2006.01)
*H01J 37/295* (2006.01)
*G02B 21/00* (2006.01)
*H01J 37/147* (2006.01)
*H01J 37/12* (2006.01)

(52) U.S. Cl.
CPC ...... *H01J 37/2955* (2013.01); *G02B 21/0048* (2013.01); *G02B 21/0052* (2013.01); *H01J 37/12* (2013.01); *H01J 37/1477* (2013.01)

(58) Field of Classification Search
USPC ........................................................ 250/311
See application file for complete search history.

(56) References Cited

U.S. PATENT DOCUMENTS

| | | | | |
|---|---|---|---|---|
| 5,900,629 | A * | 5/1999 | Todokoro | H01J 37/145 250/310 |
| 7,714,285 | B2 * | 5/2010 | Barnard | H01J 37/228 205/305 |
| 8,809,779 | B2 * | 8/2014 | Xiao | H05B 3/0047 250/306 |
| 8,981,292 | B2 * | 3/2015 | Khursheed | H01J 37/05 250/310 |
| 9,472,373 | B1 * | 10/2016 | Lanio | H01J 37/28 |
| 9,953,804 | B2 * | 4/2018 | Fichter | H01J 37/241 |
| 2002/0028399 | A1 * | 3/2002 | Nakasuji | G01N 23/225 430/30 |

* cited by examiner

*Primary Examiner* — Phillip A Johnston
(74) *Attorney, Agent, or Firm* — Klarquist Sparkman, LLP

(57) ABSTRACT

Apparatus include a reflector positioned adjacent to a sample location that is situated to receive a charged particle beam (CPB) along a CPB axis from a CPB focusing assembly so that the reflector is situated to receive light emitted from a sample at the sample location based on a CPB-sample interaction or a photon-sample interaction and to direct the light to a photodetector, and a steering electrode situated adjacent to the reflector so as to direct secondary charged particles emitted from the sample based on the CPB-sample interaction away from the reflector and CPB axis. Methods and systems are also disclosed.

24 Claims, 6 Drawing Sheets

METHOD AND APPARATUS FOR ENHANCING SE DETECTION IN MIRROR-BASED LIGHT IMAGING CHARGED PARTICLE MICROSCOPES

CROSS-REFERENCE TO RELATED APPLICATIONS

This application claims the benefit of U.S. Provisional Patent Application No. 62/610,822, filed Dec. 27, 2017. This application is also related to U.S. Provisional Patent Application 62/610,886 filed Dec. 27, 2017 and entitled "COMBINED SEM-CL FIB-IOE MICROSCOPY," and related to the U.S. Non-Provisional Application entitled "COMBINED SEM-CL FIB-IOE MICROSCOPY" that claims the benefit of 62/610,886. All of the above applications are incorporated by reference herein in their entireties.

FIELD

The field is charged particle microscopy.

BACKGROUND

Charged particle beam apparatus, such as scanning electron microscopes and focused ion beam apparatus, can be used for a variety of applications, including semiconductor processing, lithography, imaging, testing, and analysis, particularly where superior spatial resolution or depth of focus is required or desirable. However, detecting multiple characteristics or faint characteristics of charged particle beam interactions can present obstacles that can require tradeoffs in detection capabilities and apparatus performance. A need remains for improved apparatus and techniques used to detect such interactions.

SUMMARY

Apparatus include scanning electron microscopes, focused ion beam systems, and dual beam systems with optical reflectors and steering electrodes proximate the optical reflectors. According to some examples, apparatus include a reflector positioned adjacent to a sample location that is situated to receive a charged particle beam (CPB) along a CPB axis from a CPB focusing assembly so that the reflector is situated to receive light emitted from a sample at the sample location based on a CPB-sample interaction or a photon-sample interaction and to direct the light to a photodetector, and a steering electrode situated adjacent to the reflector so as to direct secondary charged particles emitted from the sample based on the CPB-sample interaction away from the reflector and CPB axis. In some embodiments, reflectors can be curved and situated to collimate or focus the light along an optical axis. In some curved reflector embodiments, curved reflectors can be parabolic, and in other curved reflector embodiments, curved reflectors can be ellipsoidal. Representative examples also include a movement stage coupled to the reflector and situated to move the reflector relative to the CPB axis or sample location. In some examples, a length of the reflector includes an extension providing an additional collection angle for the light emitted from the sample and having an extension length at least in part based on the directing of the secondary charged particles with the steering electrode away from the reflector. Some embodiments further include a movement stage coupled to the steering electrode and situated to vary one or more of a distance and angle between the steering electrode and the reflector or CPB axis. Some steering electrode examples include an antenna electrode and/or an electrostatic plate. According to some embodiments, a secondary charged particle detector is situated to receive the secondary charged particles emitted from the sample and directed by the steering electrode. Additional embodiments include the CPB focusing assembly situated to direct the CPB along the CPB axis to a focus at the sample location. In particular examples, the charged particle beam is an electron beam, the second charged particles include secondary electrons, and the light is produced by cathodoluminescence. In some examples, a length of the reflector includes an extension providing an additional collection angle for the light emitted from the sample and having an extension length at least in part based on the directing of the secondary charged particle with the reflector bias. In some examples, the reflector and the steering electrode are situated to simultaneously direct the light to the photodetector and the secondary charged particles to a secondary charged particle detector. In additional examples, the reflector is situated to receive a voltage so as to provide a bias that directs the secondary charged particles away from the reflector and CPB axis. In some examples, the reflector is situated to receive different voltages at different portions of the reflector. In selected examples, the different portions include a first portion and a second portion with the first portion receiving a larger bias than the second portion, wherein the first portion is along a strong curving section adjacent to the sample location and the second voltage is along a weaker curving section adjacent to the sample location. In some examples, a length of the reflector includes an extension providing an additional collection angle for the light emitted from the sample and having an extension length at least in part based on the directing of the secondary charged particle with the reflector bias. Some examples can further include a light source configured to emit a light beam to produce the photon-sample interaction. In some embodiments, the light emitted from the sample corresponds to a Raman emission.

According to some examples, methods include positioning a reflector adjacent to a CPB sample location situated to receive a charged particle beam (CPB) along a CPB axis from a CPB focusing assembly so that the reflector is situated to receive light emitted from the sample at the sample location based on a CPB-sample interaction or a photon-sample interaction and to direct the light to a photodetector, and positioning a steering electrode adjacent to the reflector so as to direct secondary charged particles emitted from the sample based on the CPB-sample interaction away from the reflector and CPB axis. In some examples, a length of the reflector includes an extension providing an additional collection angle for the light emitted from the sample and having an extension length at least in part based on the directing of the secondary charged particles with the steering electrode away from the reflector. In further examples, the reflector is a parabolic or ellipsoidal reflector situated to collimate or focus the light along an optical axis. In additional examples, methods include directing the CPB to the sample, detecting the light with the photodetector, and detecting the secondary charged particles with a charged particle detector. In some embodiments, the CPB is an electron beam, the second charged particles are secondary electrons, and the light comprises cathodoluminescence.

According to a further aspect of the disclosed technology, system include at least one processor and one or more computer-readable storage media including stored instructions that, responsive to execution by the at least one processor, cause the system to control a-voltage of a steering electrode situated adjacent to a reflector so as to direct secondary charged particles away from the reflector and a charged particle beam (CPB) axis, wherein the second charged particles are emitted from a sample at a sample location based on an interaction between a CPB propagating along a CPB axis and the sample, wherein the reflector is positioned adjacent to the sample location and the sample location is situated to receive the CPB along the CPB axis from a CPB focusing assembly so that the reflector is situated to receive light emitted from the sample based on the CPB-sample interaction or a photon-sample interaction and to direct the light to a photodetector.

According to additional aspects of the disclosed technology, any of the disclosed embodiments can be used in a combined SEM/FIB system such as those described in the patent applications entitled "COMBINED SEM-CL FIB-IOE MICROSCOPY," which are considered to be part of this application and are incorporated by reference herein in its entirety.

The foregoing and other features and advantages of the disclosed technology will become more apparent from the following detailed description, which proceeds with reference to the accompanying figures.

DETAILED DESCRIPTION

Figure 1:
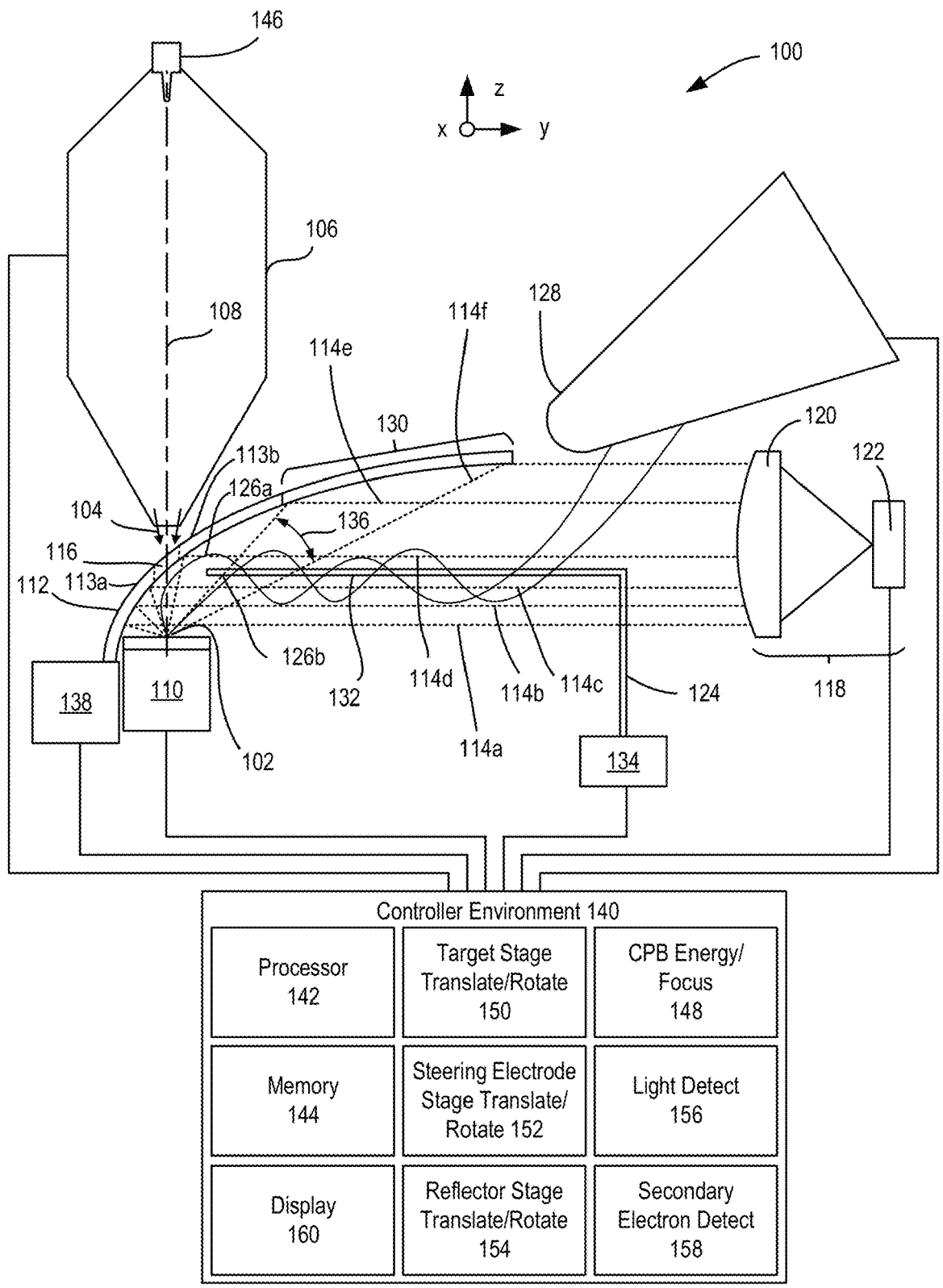
FIG. 1 shows a side view schematic of an example charged particle apparatus.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Herein, charged particle beams generally refers to beams containing positively or negatively charged particles, such as electrons, protons, and ions. Charged particle beam ions can include positively or negatively charged ions of Gallium, Oxygen, Cesium, noble gases, as well as other ion species can be used. Charged particle mass and charged particle velocity can be associated with a spatial resolution of images formed based on an interaction between charged particle beams and samples. Example apparatus herein can obtain lateral resolutions of less than equal to 1 µm, 100 nm, 50 nm, 10 nm, 5 nm, 1 nm, 0.1 nm, or 0.01 nm. Representative electron or ion energies can include can include 10 eV or greater, 100 eV or greater, 500 eV or greater, 1 keV or greater, 8 keV or greater, 10 keV or greater, 30 keV or greater, 100 keV or greater, etc., though other energies are possible.

Interactions between samples and charged particle beams (or light beams) are typically defined by an interaction volume and produce various particle emissions from the sample, including particles emitted from a surface of the sample, from a sub-surface of the sample, or from particles or ejected material in proximity to the sample. Particle emissions can include back-scattered particles such as back-scattered electrons, protons, or ions, that typically retain a substantial portion of the energy of the particles of the incident charged particle beam, e.g., based on elastic or inelastic collisions. With light beam interactions (e.g., Raman imaging), emitted particles are photons.

Particle emissions from the sample can also include secondary electrons and secondary ions that correspond to emissions from sample atoms that have been excited by the incident charged particle beam. Secondary electron energies and secondary ion energies can vary substantially based on the energy of the incident charged particle beam as well as the specific materials of the sample and corresponding ionization energies. Representative secondary particle energies can include from a few eV to several hundreds of eV in some examples, though tens of eV are more typical, and higher energy particles can decay into additional lower energy secondary particles.

Particle emissions from the sample can also include photons (e.g., "light," or "light particles") at various energies typically ranging from infrared to x-ray. Some emitted light particles correspond to cathodoluminescence (CL) or ion-based luminescence (iL) produced by the interaction between the charged particle beam and the sample, as excited ions or electrons de-excite, including secondary electrons or secondary ions ejected from the sample at different depths. Other examples include photon emission from a photon-sample interaction, and emitted particles can correspond to emitted photons, such as Raman emission.

Beams are typically described in relation to beam propagation axes and are generally shown at normal incidence with samples. It will be appreciated that a variety of incidence angles can be provided ranging from grazing incidence to normal incidence. Typically, a beam axis includes one or more straight line segments along which a light or charged particle beam propagates or along which one or more optical elements are situated. Such axes can be bent, folded, or varied with reflective surfaces or charged particle directing components, so that axes need not be single straight line segments. Apparatus are described that can include one or more lenses, reflectors, deflectors, etc., that can be electrostatically or magnetostatically configured to alter or focus charged particle trajectories. Samples that receive charged particle beams or light beams can include semiconductor targets, metal targets, or other targets. Detected secondary electrons, secondary ions, and light particles can be used to form images of samples, including sample shapes, layers, depths, and profiles, and to determine the presence (or absence) of different elements and structures, such as through spectral analysis of detected signals.

FIG. 1 shows an example of an apparatus 100 that can be used to enhance secondary electron detection charged particle systems. In some examples, the apparatus 100 is electron beam microscope, focused ion beam microscope, a dual-beam microscope with an electron beam and focused ion beam, an electron microscope that includes light sources that emit light beams (e.g., for SEM Raman imaging), or another microscope apparatus. Any of the examples herein can be used in a combined FIB/SEM apparatus such as those described in the patent applications entitled "COMBINED SEM-CL FIB-IOE MICROSCOPY," which are incorporated by reference herein. Representative embodiments can provide scanning of charged particle beams across sample surfaces, such as with a scanning electron microscope (SEM) or scanning transmission electron microscope (STEM). The apparatus 100 is generally situated to support a charged particle target 102, such as a sample to be analyzed in an electron microscope, focused ion beam system, etc. A charged particle beam 104, such as beam of electrons or ions, is focused with a lens arrangement 106 (typically comprising one or more electric or magnetic lens elements in a columnar arrangement) along a charged particle beam axis 108 and directed to the target 102. In typical examples, the lens arrangement 106 can also provide scanning of the charged particle beam 104 in one or more directions in relation to the target 102. The target 102 is typically supported by a sample movement stage 110 that can be translated and/or rotated in various directions so that the target 102 can be positioned at a suitable plane or position relative to the charged particle beam 104, such as at a focus. In particular examples, the sample movement stage 110 allows movement of the sample to a eucentric focus location of an electron beam and a differently-angled focused ion beam. The sample movement stage 110 can then further allow rotation of the sample at the eucentric focus so that the sample can be in view of the electron beam or the focused ion beam. In different examples, the target 102 can be grounded or biased, including with a variable bias such as with a device test signal.

Representative embodiments of the apparatus 100 further include a reflector 112 (shown in cross-section), typically in the form of a curved mirror, such as with a parabolic or ellipsoidal shape, positioned adjacent to the target 102. The charged particles of the charged particle beam 104 interact with the target 104 so as to produce various particle emissions at the target 102, including emissions occurring in proximity to the focus location of the charged particle beam 104 as emitted particles relax to various lower energy states and emit additional particles. Some particle emissions can include light emission at various wavelengths, and the reflector 112 is situated to receive a portion of the emitted light as light particles 114a-114f and to direct the light along a direction different from the charged particle beam axis 108 (e.g., perpendicular to the charged particle beam axis 108). In typical examples, various angles of the emitted light particles 114a-114f are directed parallel to each other as a collimated beam, as shown in FIG. 1, though directing the light, or different angle ranges of the light, in one or more directions other than collimated is also possible. Various geometrical characteristics of the reflector 112 can be adjusted to vary light direction, including symmetrically or asymmetrically, circular or elliptical paraboloids, aberration correction, etc. Some examples can include elliptical shapes such that reflected light is focused at one or more points or lines rather than collimated. In some elliptical shapes, reflective surfaces or lengths can extend passed elliptical co-vertices. Reflector shapes can also be varied based on shape or extent of the interaction (or expected interaction) of the charged particle beam and sample.

Representative examples of the reflector 112 include an aperture 116 situated so as to allow the charged particle beam 104 to pass through the reflector 112 along the charged particle beam axis 108 and to the target 102. An optical detection arrangement 118, such as a spectrometer or other optical assembly, can be situated to receive and detect the light particles 114a-114f. In some examples, the optical detection arrangement 118 can include an optical focusing element 120 (e.g., one or more refractive and/or reflective components) that direct the received light particles 114a-114f to an optical detector 122. Various optical arrangements can be used, including free-space and/or fiber-coupled, to detect monochromatic or multichromatic light. In some examples, optical detectors can include one or more of a photodiode, APD, PMT, CCD, and/or CMOS sensor. In representative embodiments, the emitted light particles 114a-114f correspond to cathodoluminescence emitted based on the interaction between the charged particle beam 104 and the target 102. In further examples, a light beam can be directed to the target along an optical axis, e.g., such as the charged particle beam axis 108 or another axis provided with a separate optical column, and the emitted light particles 114a-114f are formed by an interaction between the sample and the light beam. Thus, in selected examples, imaging or probing of the target 102 can be performed with an electron or other CPB, with associated photons being collected with the reflector 112, and imaging or probing of the target 102 can also be performed a light source, with associated photons also being collected with the reflector 112. Suitable light sources can generate light beams with incandescent bulbs, light emitting diodes, laser diodes, fiber lasers, as well as other sources. For simplicity of illustration, only one column is shown in FIG. 1 (corresponding to a CPB column), though it will be appreciated that multiple different columns can be arranged for emitting and directing different beams to the target 102 (e.g., at angles to each other such as shown in the patent applications entitled "COMBINED SEM-CL FIB-IOE MICROSCOPY" that are incorporated by reference herein).

In representative examples, the apparatus 100 also includes a steering electrode 124 adjacent to the reflector 112 and that is biased to produce an electric field proximate the target 102. Example bias voltages for the steering electrode can include less than ±0.5 V, ±0.5 V or greater, ±2 V or greater, ±5 V or greater, ±10 V or greater, ±20 V or greater, ±50 V or greater, etc. As the target 102 and the charged particle beam 104 interact, various particles are produced with different energies and trajectories including x-rays, back-scattered electrons, and secondary electrons, such as secondary electrons 126a, 126b. The electric field produced by the steering electrode 124 changes the paths of the secondary electron 126a, 126b to reduce a likelihood of contact with the reflective surface of the reflector 112. In some examples, a particle detector 128 is situated to receive the secondary electrons 126a, 126b steered by the steering electrode 124. In particular examples, the position of the particle detector 128 is such that absent the steering electrode, very few or none of the secondary electrons could be detected by the particle detector 128. Representative particle detectors 128 can include Everhart-Thornley detectors which typically include a Faraday cage 130 that is biased to attract the secondary electrons 126a, 126b. The particle detector 128 can be positioned above the reflector 112 as shown, though other positions are possible, including below or to a side. In some examples, the reflector 112 can be biased with a voltage so as to provide an electric field that directs secondary electrons, such as the secondary electrons 126a, 126b, away from the reflector 112. Example bias voltages can include less than ±0.5 V, ±0.5 V or greater, ±2 V or greater, ±5 V or greater, ±10 V or greater, ±20 V or greater, ±50 V or greater, etc. The secondary electrons can then be further directed or extracted by the steering electrode 124 and received and detected by the particle detector 128. In particular examples, the reflector 112 can be biased differently in different portions of the reflector 112. For example, in a push electrode configuration, the reflector 112 can have a portion 113a left of the emission point of the target 102 as depicted in FIG. 1 that can be biased higher than a portion 113b that is to the right of the emission point. In some examples, the steering electrode 124 can include one or more magnetic elements.

Representative examples of the steering electrode 124 can include an antenna portion 132 that can be made to extend longitudinally along a direction similar to the propagation of one or more of the light particles 114a-114f so that the antenna portion 132 can be situated proximate the target 102. A corresponding electric field that extends from the antenna portion 132 with a voltage bias can cause the secondary electrons 126a, 126b to orbit the antenna portion 132 before being received by the particle detector 128. In some examples, a movement stage 134 can be coupled to the steering electrode 124 to translate and/or rotate the steering electrode 124 so that the steering electrode 124 can be inserted or positioned into a suitable location relative to the reflector 112, target 102, and particle detector 128. The antenna portion 132 can have various shapes, including linear, curved, segmented (e.g., with alternating insulating and conductive portions), bent, or a combination. In some examples, a longitudinal shape of the antenna portion 132 can be aligned with an optical axis of the reflector 112, and in other examples the longitudinal shape can be situated at an angle to an optical axis of the reflector 112. The movement stage 134 is configured to keep the steering electrode 124 in a fixed position during emission of the charged particle beam 104, though in some examples, the movement stage 134 can move, vibrate, or scan the steering electrode 124 during emission. In further embodiments, the voltage applied to the steering electrode 124 can be varied with respect to time during emission, such as according to an oscillating or other time-dependent signal.

With the secondary electrons 126a-126b directed away from the reflector by the steering electrode 124, the reflector 112 can be configured in various way to improve performance. Usual approaches to compensate for poor secondary electron collection efficiencies, such as increasing charged particle beam current or increasing dwell time, can be mitigated with the described approaches herein. For example, improved collection efficiency can be achieved without increasing current, thereby avoiding a tradeoff in resolution, and increased dwell times can be avoided that could cause a reduction in signal fidelity or that could damage the target to be imaged (particularly with ions).

In some examples, the reflector 112 includes an extended length 130 that can be used to reflect additional angles of light particles, including the light particle 114f and an angle range 136 between the light particles 114e, 114f. Representative lengths for the extended length 130 can include increases of 2% or greater, 5% or greater, 10% or greater, 20% or greater, 50% or greater, 100% or greater, etc., such as increases of 5 mm, 30 mm, 60 mm, etc. The extended length 130 can be selected in relation to the extent to which the secondary electrons 126a, 126b can be directed away from the extended length 130 by the steering electrode 124. In further examples, the extended length 130 can be further extended based on the biasing of the reflector 112. In some examples, the reflector 112 is positioned more closely to the target 102, as the directing of the secondary electrons 126a, 126b with the steering electrode 124 away from the reflector 112 can provide additional margin for collection. The closer positioning of the reflector 112 allows the lens arrangement 106 to be moved along the charged particle beam axis 108 closer to the target 102 without obstruction by the reflector 112, thereby allowing a shorter working distance and performance improvements such as finer spatial resolution. Representative translation distances for the lens arrangement are typically in mm or cm (e.g., 1 mm, 4 mm, 10 mm, etc.) and can correspond to a 0.1% or greater, 0.5% or greater, 2% or greater, 5% or greater, 10% or greater, 50% or greater reduction of a nominal distance between the target 102 and an output of the lens arrangement 106.

In representative examples, the reflector 112 can be coupled to a movement stage 138 to precisely align the reflector 112 with the target 102, charged particle beam axis 108, and corresponding light emitted by the sample. The movement stage 138 can also be used to move the reflector 112 as the target 102 is moved, e.g., for processing by one or more other charged particle beams, or to completely remove the reflector 112 from the area of the target 102. While the movement stage 138 as shown is coupled proximate a vertex end of the reflector 112, the movement stage 138 can be coupled to the reflector at other locations as well, such as an opposite end or to one or more other sides.

The apparatus 100 can also be coupled to a controller environment 140 that can be used to receive signals from and/or control various components. The controller environment 140 can include one or more computing devices that include at least a processor 142 and a memory 144. Computing devices can include desktop or laptop computers, mobile devices, tablets, logic controllers, etc. The processor 142 can include one or more CPUs, GPUs, ASICs, PLCs, FPGAs, PLDs, CPLDs, etc., that can perform various data processing or I/O functions associated with the controller environment 140, such as control and/or data processing. The memory 144 can be volatile or non-volatile (e.g., RAM, ROM, flash, hard drive, optical disk, etc.), fixed or removable, and is coupled to the processor 142. The memory 144 can provide storage capacity for one or more computer-readable media. One or more system buses can provide a communication path between various environment components. The controller environment 140 can also be situated in a distributed form so that applications and tasks are performed by remote processing devices that are linked through a communications network. In a distributed computing environment, program modules and logic can be located in both local and remote memory storage devices. In some examples, components in the controller environment 140 need not be linked with other components.

The controller environment 140 can be coupled to the lens arrangement 106 and a charged particle beam source 146, and include control logic 148 to vary different characteristics of the charged particle beam 104, such as through variation of lens electrode and/or emission source voltages. The controller environment 140 can also be coupled to the movement stages 110, 134, 138 with movement stage controls 150, 152, 154 to vary respective translations and/or rotations of the target 102, steering electrode 124, and reflector 112. The controller environment 140 can be further coupled to the optical detector 122 with light detect I/O 156 so as to receive an optical detection signal associated with the light particles 114a-114f. The controller environment 140 can also be coupled to the particle detector 128 with particle detector I/O 158 so as to receive a particle detection signal associated with the secondary electrons 126a, 126b that are directed by the steering electrode 124. In representative embodiments, the detections signals from the particle detector 128 and the optical detector 122 can be received simultaneously based on the interaction between the charged particle beam 104 and the target 102. In further examples, a display 160 can be situated to show detected signals, sample images, electrode voltages, stage parameters, etc.

Algorithms for aligning reflector, detector, and steering electrode components can be embodied as software or firmware instructions carried out by a digital computer. For instance, any of the disclosed techniques can be performed by a computer or other computing hardware that is part of a charged particle beam microscope system. The charged particle beam microscope system can be connected to or otherwise in communication with detectors 118, 128 and be programmed or configured to receive optical and charged particle detection signals and perform imaging or material analysis computations (e.g., any of the techniques disclosed or incorporated herein). The computer can be a computer system comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed techniques. The results of the computations can be stored (e.g., in a suitable data structure or lookup table) in the one or more tangible, non-transitory computer-readable storage media and/or can also be output to the user, for example, by displaying, on the display 160, with a graphical user interface.

Example 1: Weakly Curved Ellipsoidal Reflector without Steering Electrode

Figure 2:
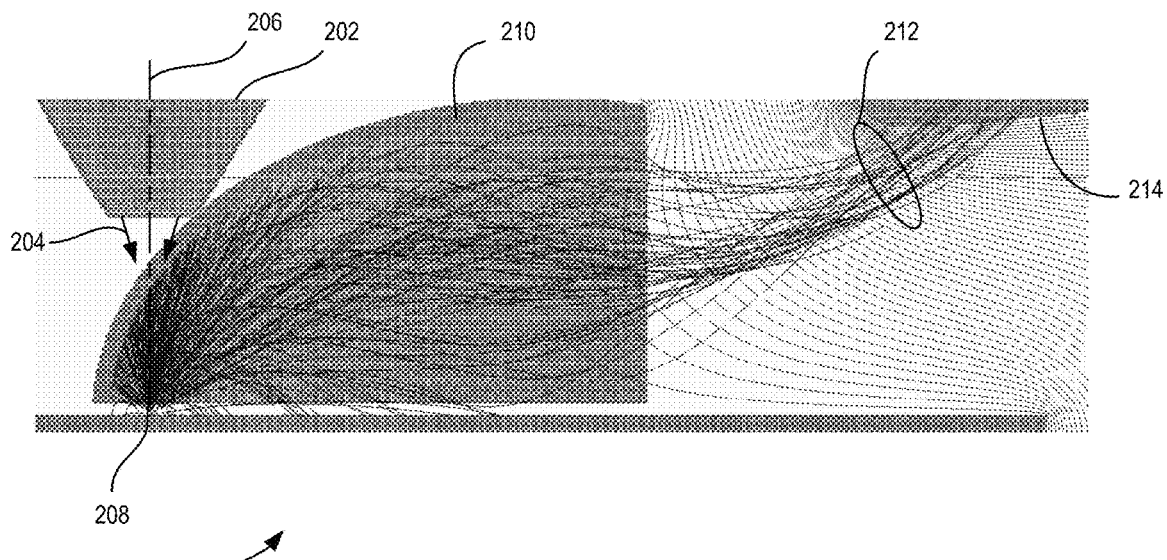
FIGS. 2-4 show side view schematics of charged particle arrangements.

FIG. 2 shows an example of a charged particle beam arrangement 200 with a particle model trace. The charged particle beam arrangement 200 includes a charged particle beam lens arrangement 202 situated to focus a charged particle beam 204 along an axis 206 at a sample target 208. An ellipsoidal reflector 210 is situated between the output of the charged particle beam lens arrangement 202 and the sample target 208 to direct emitted light particles associated with the interaction between the focused charged particle beam 204 and the sample target 208 in a direction associated with the ellipsoidal shape and orientation of the ellipsoidal reflector 210. The ellipsoidal reflector 210 is coupled to a voltage source to become negatively biased at a low voltage (−1.5 V) during emission of the charged particle beam 204 so that secondary electrons 212 emitted by the sample target 208 with selected trajectories are directed away from the ellipsoidal reflector 210 so as to become captured by a positively biased electric field of an adjacent Everhart-Thornley electron detector 214. The ellipsoidal reflector 210 has a generally weak curvature, such as defining a focal length of about 10 mm, resulting in additional volume for secondary electrons to propagate before contact with an interior concave surface. Collection efficiencies typically correspond to a percentage of the total secondary electrons emitted within a predetermined useful energy range that are detected by a particle detector. Secondary electron collection efficiencies by the electron detector 214 of approximately 15% are obtained, and photon collection efficiency by the ellipsoidal reflector 210 of about 70% can be achieved. However, the additional volume provided by the weak curvature, presents a minimum working distance between the output end of the charged particle beam lens arrangement 202 and the sample target 208 based obstruction from the outer convex surface of the ellipsoidal reflector 210.

Example 2: Strongly Curved Ellipsoidal Reflector without Steering Electrode

Figure 3:
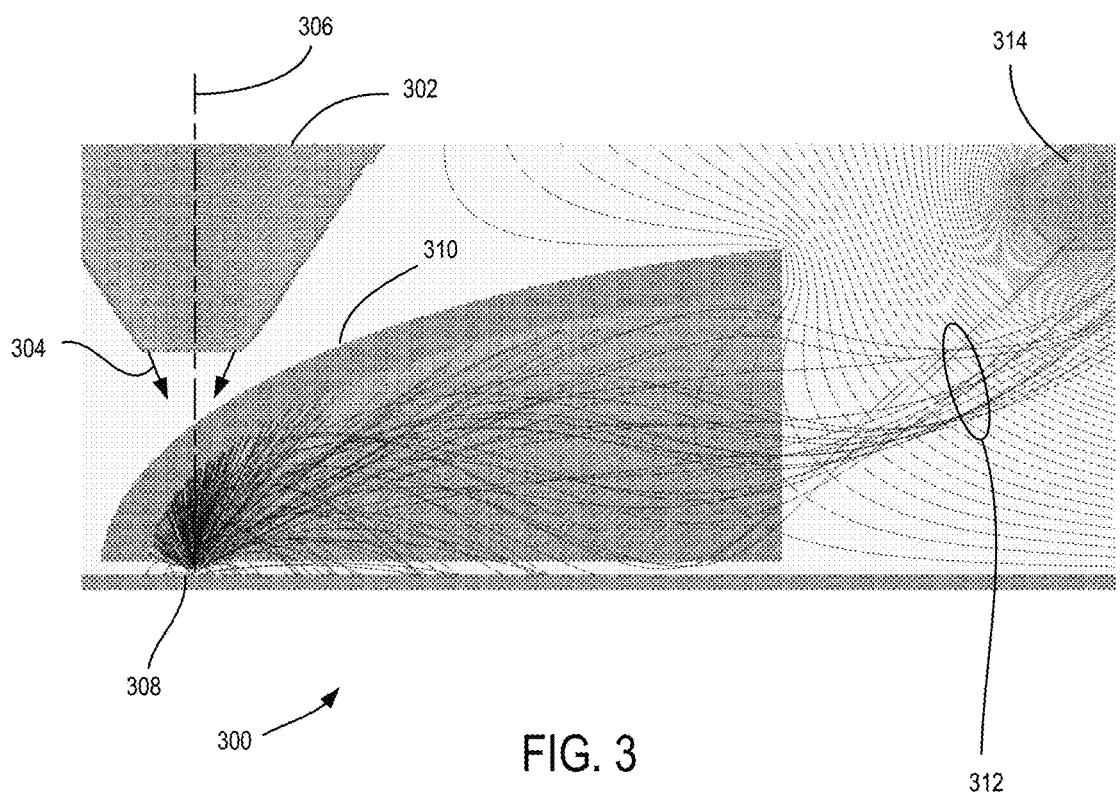

FIG. 3 shows an example of a charged particle beam arrangement 300 with a particle model trace. The charged particle beam arrangement 300 includes a charged particle beam lens arrangement 302 situated to focus a charged particle beam 304 along an axis 306 at a sample target 308. An ellipsoidal reflector 310 is situated between the output of the charged particle beam lens arrangement 302 and the sample target 308 to direct emitted light particles associated with the interaction between the focused charged particle beam 304 and the sample target 308 in a direction associated with the ellipsoidal shape and orientation of the ellipsoidal reflector 310. The ellipsoidal reflector 310 is coupled to a voltage source to become negatively biased at a low voltage (−1.5 V) during emission of the charged particle beam 304 so that secondary electrons 312 emitted by the sample target 308 with selected trajectories are directed away from the ellipsoidal reflector 310 so as to become captured by a positively biased electric field of an adjacent Everhart-Thornley electron detector 314. The ellipsoidal reflector 310 has a length similar to the length of the ellipsoidal reflector 210 but has a focal length that is twice that of the ellipsoidal reflector 210. The ellipsoidal reflector 310 also has a generally stronger curvature compared to the ellipsoidal reflector 210, resulting in a reduced volume for secondary electrons to propagate before contact with an interior concave surface. Consequently, relatively poor secondary electron collection efficiencies by the electron detector 314 of only approximately 5.5% are obtained, and a suitable photon collection efficiency by the ellipsoidal reflector 310 of about 70% can be achieved. However, the stronger curvature of the ellipsoidal reflector 310 also allows a shorter distance between the output of the charged particle beam lens arrangement 302 and the sample target 308 before obstruction by the outer convex surface of the ellipsoidal reflector 310.

Example 3: Extended Parabolic Reflector with Steering Electrode

Figure 4:
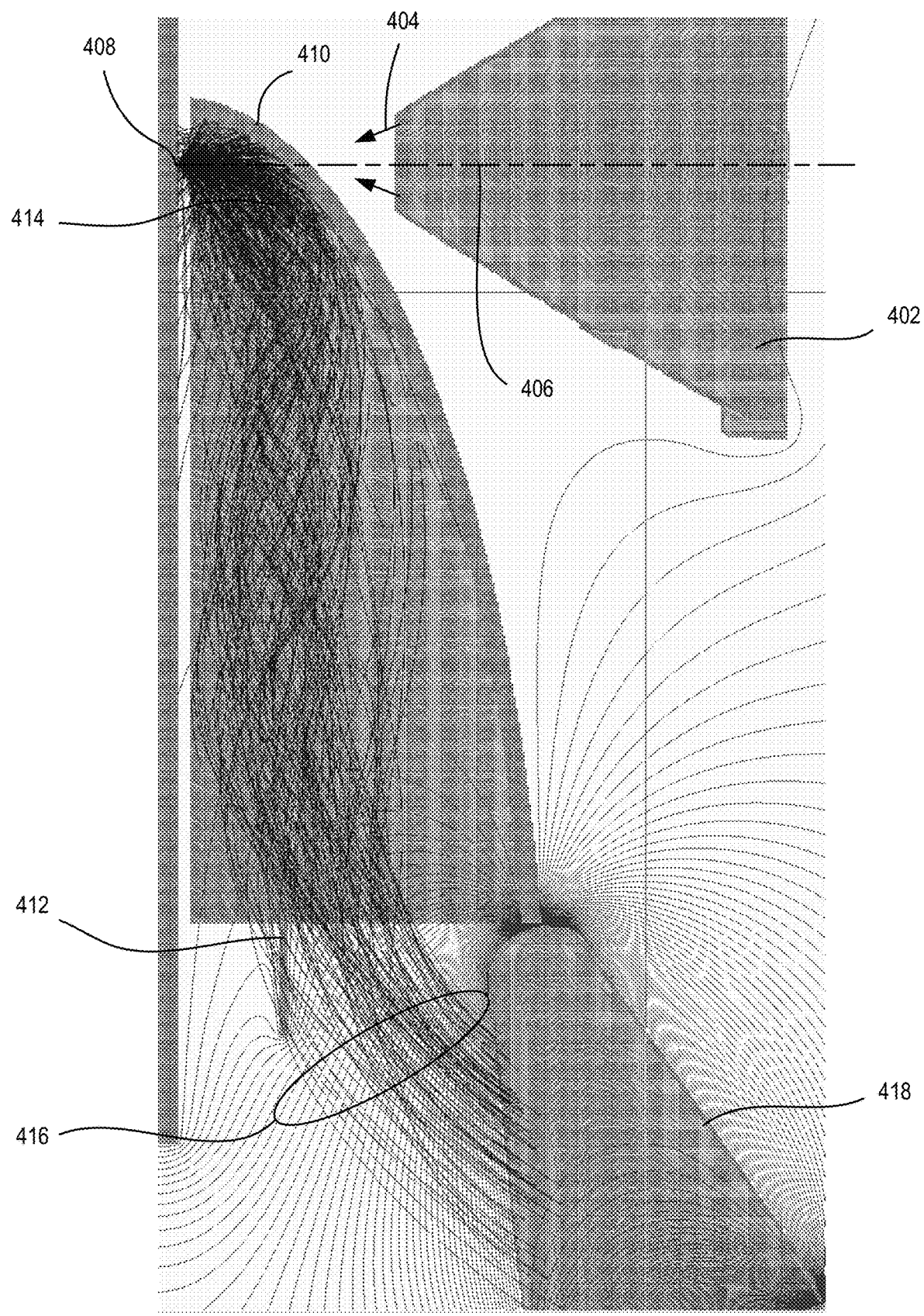

FIG. 4 shows an example of a charged particle beam arrangement 400 with a particle model trace. The charged particle beam arrangement 400 includes a charged particle beam lens arrangement 402 situated to focus a charged particle beam 404 along an axis 406 at a sample target 408. An ellipsoidal reflector 410 is situated between the output of the charged particle beam lens arrangement 402 and the sample target 408 to direct emitted light particles associated with the interaction between the focused charged particle beam 404 and the sample target 408 in a direction associated with the parabolic shape and orientation of the ellipsoidal reflector 410. In this example, the ellipsoidal reflector 410 is not biased and can be coupled to a ground voltage. A wire-shaped steering electrode 412 is coupled to a voltage source to become negatively biased at a selected voltage (here 9.5 V) during emission of the charged particle beam 404 and is inserted such that a tip 414 is situated proximate the sample target 408 between a concave inner surface of the ellipsoidal reflector 410 and the sample target 408. During emission of the charged particle beam 404, secondary electrons 416 emitted by the sample target 408 with selected trajectories toward the ellipsoidal reflector 410 become redirected by the steering electrode 412 so as to become captured by a positively biased electric field of an adjacent Everhart-Thornley electron detector 418. Based on the redirecting provided by the steering electrode 412, the ellipsoidal reflector 410 has an extended length. The ellipsoidal reflector 410 can also have a strong curvature compared to the ellipsoidal reflector 210, resulting in a reduced volume for secondary electrons to propagate before contact with an interior concave surface. The redirecting of the secondary electrons 416 by the steering electrode 412 allows secondary electron collection efficiencies by the electron detector 418 of approximately 18.5%, and a photon collection efficiency by the ellipsoidal reflector 410 of about 73% can be achieved. Also, the stronger curvature of the ellipsoidal reflector 410 allows a shorter distance between the output of the charged particle beam lens arrangement 402 and the sample target 408 before obstruction by the outer convex surface of the ellipsoidal reflector 410.

Example 4: Electrostatic Redirector

Figure 5:
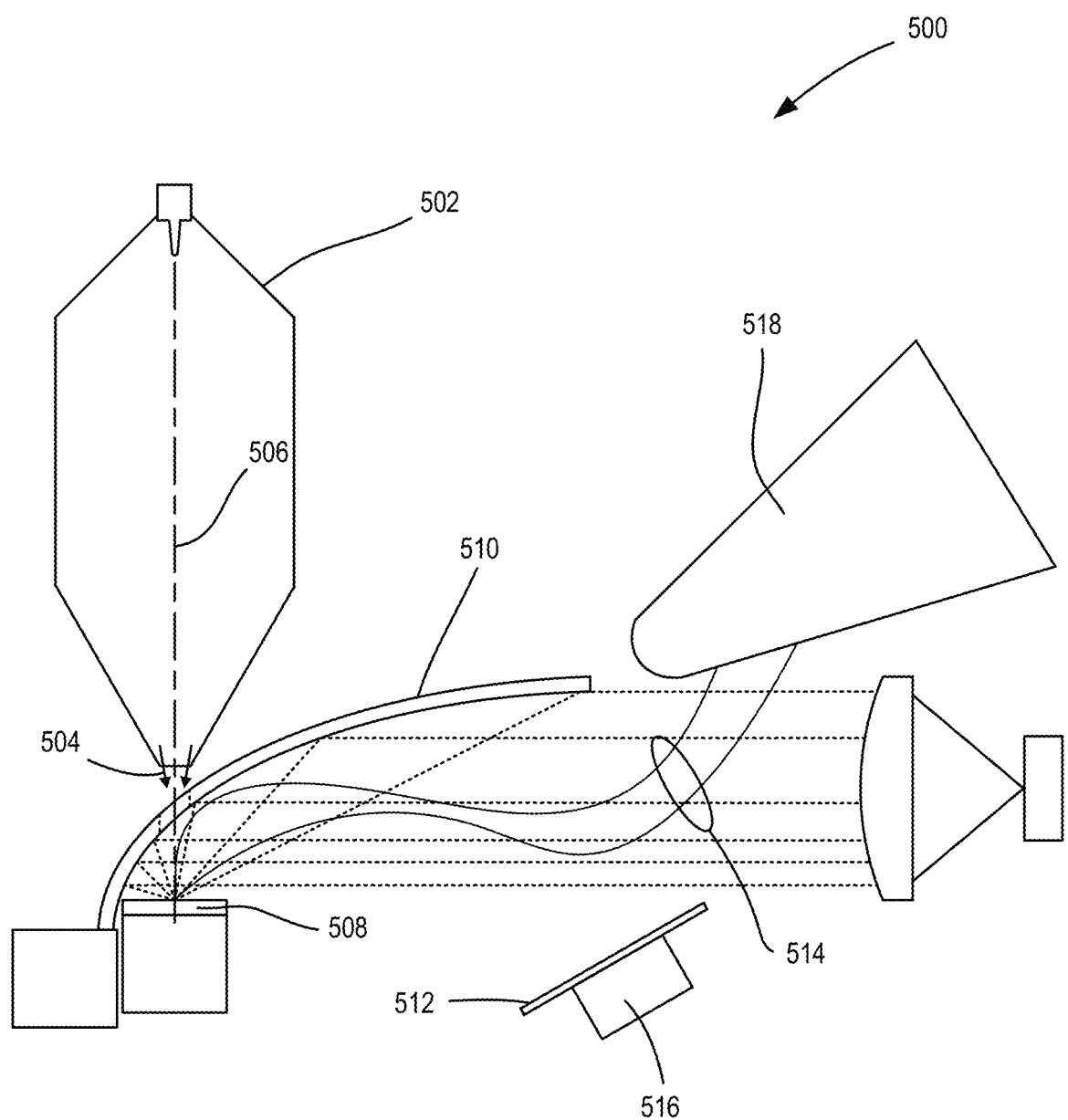
FIG. 5 shows a side view schematic of another example charged particle apparatus.

FIG. 5 shows an example of a charged particle beam arrangement 500 that includes a charged particle beam lens arrangement 502 situated to focus a charged particle beam 504 along an axis 506 at a sample target 508. A parabolic reflector 510 is situated between the output of the charged particle beam lens arrangement 502 and the sample target 508 to direct emitted light particles associated with the interaction between the focused charged particle beam 504 and the sample target 508 in a direction associated with the parabolic shape and orientation of the parabolic reflector 510. The charged particle beam arrangement 500 also includes an secondary electron redirector 512 situated to change propagation paths of secondary electrons 514 emitted by the interaction between the charged particle beam 504 and the sample target 508. In representative examples, the secondary electron redirector 512 is an electrostatic plate that extends an electric field variation to the volume between the parabolic reflector 510 and the sample target 508 so as to redirect the emitted secondary electrons 514. Various electrostatic plate configurations can be used, including flat, curved, segmented, etc. The secondary electron redirector 512 can be coupled to a movement stage 516 that can provide translation and/or rotation so as to selectively align the secondary electron redirector 512 in relation to the sample target 508, parabolic reflector 510, and a secondary electron detector 518, such as an Everhart-Thornley detector. In typical examples, the secondary electron redirector 512 is situated in a fixed position relative to the parabolic reflector 510 and the secondary electron detector 518, though scanning movement by the movement stage 516 can be performed in some examples and/or bias voltage variation. In further examples, the secondary electron redirector 512 can include a magnetostatic redirector.

Example 5: Elliptical Reflector

Figure 6:
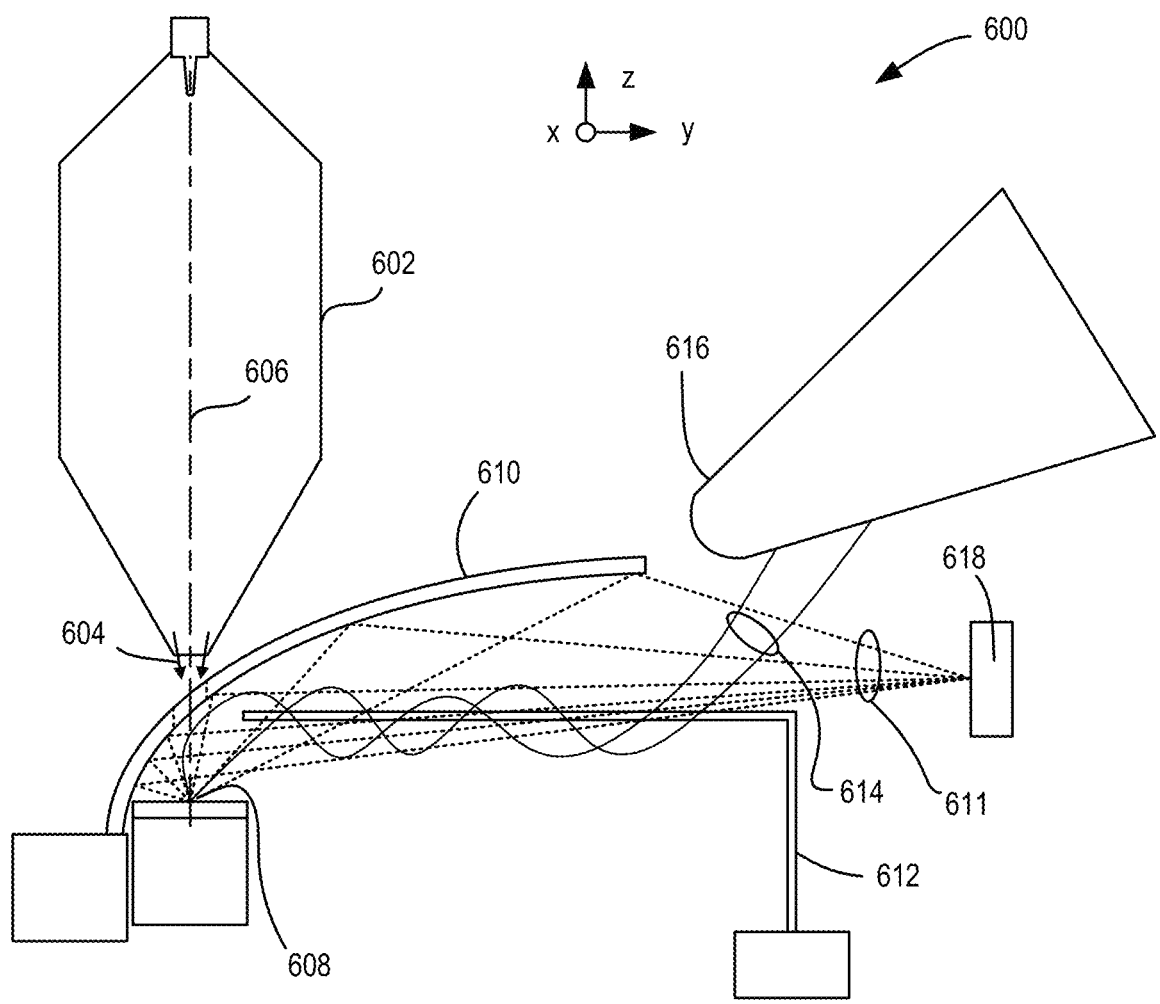
FIG. 6 shows a side view schematic of another example charged particle apparatus.

FIG. 6 shows an example of a charged particle beam arrangement 600 that includes a charged particle beam lens arrangement 602 situated to focus a charged particle beam 604 along an axis 606 at a sample target 608. An elliptical reflector 610 is situated between the output of the charged particle beam lens arrangement 602 and the sample target 608 to direct emitted light particles 611 associated with the interaction between the focused charged particle beam 404 and the sample target 408 in a direction associated with the elliptical shape and orientation of the elliptical reflector 610 and to a focus based on the ellipticity of the elliptical reflector 610. A wire-shaped steering electrode 612 is coupled to a voltage source so as to direct secondary electrons 614 or other charged particles emitted by the sample target 608 with selected trajectories toward the elliptical reflector 610 become redirected by the steering electrode 612 so as to become captured by a particle detector 616. Based on the redirecting provided by the steering electrode 612, the elliptical reflector 610 can have an extended length. An optical detector 618 or other optical elements (e.g., lens, reflector, etc.) can be situated at the focus or adjacent to the focus so as to receive the emitted light particles 611 reflected by the elliptical reflector 610. In some examples, the optical detector 618 includes an optical fiber with an endface or other associated coupling optics situated at the focus so as to receive the emitted light particles 611. Representative examples coupling the light particles 611 into an optical fiber do not retain angle information associated with the light particles.

COMPARISON OF SELECTED EXAMPLES

The following table shows performance outcomes for various ellipsoidal and parabolic reflector configurations, including related photon collection efficiencies (CE), secondary collection efficiencies, and electron redirection voltages. It will be appreciated the following examples are not exhaustive, and that various potentials, efficiencies, and other features can be varied between apparatus. Thus, in some examples, an improvement in secondary electron collection efficiency is achieved over that obtained from conventional dual FIB-SEM apparatus that are not also capable of detecting light particles with ellipsoidal or parabolic reflectors.

TABLE 1

Collection Efficiencies for Different Mirror Configurations

| Mirror Configuration | Photon CE (%) | SE CE (%) | Voltages |
|---|---|---|---|
| Long mirror base | 73% | 6% | 0 |
| Long mirror long wire | 73% | 18.5% | −1.5 mirror, 9.5 wire |
| Long mirror with push electrode | 73% | 9.8% | 0 mirror, −8 push electrode |
| Medium mirror large semi-minor | 70% | 15% | −1.5 V mirror |
| Medium mirror small semi-minor | 70% | 5.5% | −1.5 V mirror |
| Short mirror | 64% | 22% | −1.5 V mirror |
| No mirror, dual SEM-FIB w/ETD | | 15% | |

METHOD EXAMPLES

Figure 7:
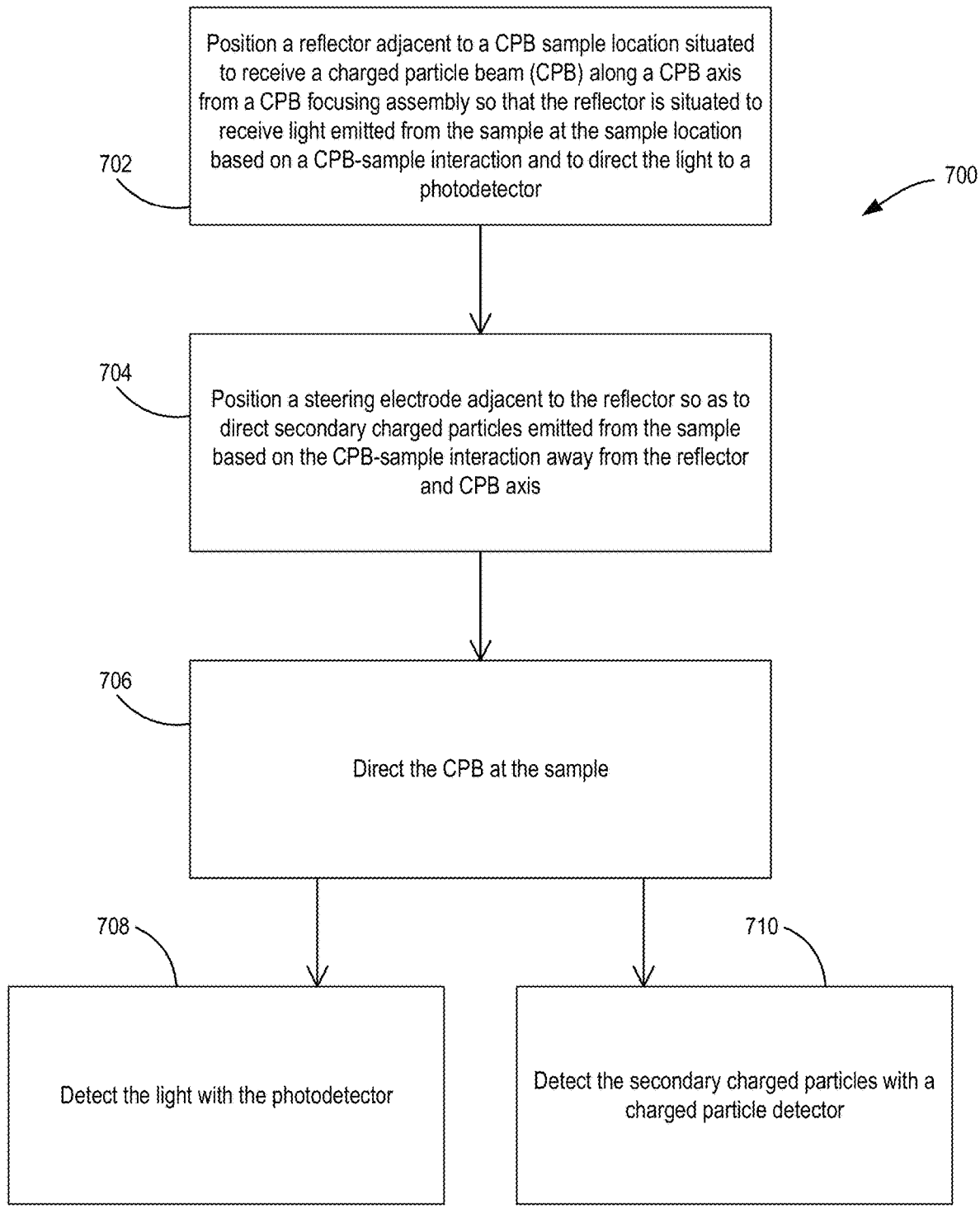
FIG. 7 is a flowchart of example methods.

FIG. 7 shows an example of a method 700 that can be used to detect particles emitted from a sample during an interaction between a charged particle beam and the sample. At 702, a reflector, such as a parabolic or ellipsoidal reflector, is positioned adjacent to the sample that is situated to receive a charged particle beam along a charged particle beam axis of a charged particle beam focusing assembly, such an electron beam column or focused ion beam column. The reflector is situated to receive light emitted from the sample based on the interaction between the charged particle beam and the sample and to direct the light to a photodetector. At 704, a steering electrode is positioned adjacent to the reflector so as to direct secondary charged particles emitted from the sample, based on the interaction between the charged particle beam and sample, away from the reflector and charged particle beam axis. At 706, the charged particle beam is generated with the scanning electron microscope column, focused ion beam column, or other charged particle source, and is directed to the sample. The light emitted by the interaction between the sample and the charged particle beam is collected by the reflector. At 708, the collected light is directed to a photodetector. The secondary charged particles emitted by the interaction between the sample are redirected by the steering electrode and received by a charged particle detector. At 710, the received secondary charged particles (typically secondary electrons) are detected by the charged particle detector. In some examples, a length of the reflector includes an extension providing an additional collection angle for the light emitted from the sample, with the extension length at least in part based on the directing of the secondary charged particles with the steering electrode away from the reflector.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. An apparatus, comprising:
a reflector positioned adjacent to a sample location that is situated to receive a charged particle beam (CPB) passing through a reflector aperture along a CPB axis from a CPB focusing assembly so that the reflector is situated to receive light emitted from a sample at the sample location based on a CPB-sample interaction or a photon-sample interaction and to direct the light to a photodetector; and
a steering electrode situated adjacent to the reflector so as to direct secondary charged particles emitted from the sample based on the CPB-sample interaction away from the reflector and CPB axis.

2. The apparatus of claim 1, wherein the reflector is a curved reflector situated to collimate or focus the light along an optical axis.

3. The apparatus of claim 2, wherein the curved reflector is a parabolic reflector or an ellipsoidal reflector.

4. The apparatus of claim 1, further comprising a movement stage coupled to the reflector and situated to move the reflector relative to the CPB axis or sample location.

5. The apparatus of claim 1, wherein a length of the reflector includes an extension providing an additional collection angle for the light emitted from the sample and having an extension length at least in part based on the directing of the secondary charged particles with the steering electrode away from the reflector.

6. The apparatus of claim 1, further comprising a movement stage coupled to the steering electrode and situated to vary one or more of a distance and angle between the steering electrode and the reflector or CPB axis.

7. The apparatus of claim 6, wherein the steering electrode comprises an antenna electrode.

8. The apparatus of claim 6, wherein the steering electrode comprises an electrostatic plate.

9. The apparatus of claim 1, further comprising a secondary charged particle detector situated to receive the secondary charged particles emitted from the sample and directed by the steering electrode.

10. The apparatus of claim 1, further comprising the CPB focusing assembly situated to direct the CPB along the CPB axis to a focus at the sample location.

11. The apparatus of claim 1, wherein the CPB comprises an electron beam, the second charged particles comprise secondary electrons, and the light comprises cathodoluminescence.

12. The apparatus of claim 11, wherein a length of the reflector includes an extension providing an additional collection angle for the light emitted from the sample and having an extension length at least in part based on the directing of the secondary charged particle with the reflector bias.

13. The apparatus of claim 1, wherein the reflector and the steering electrode are situated to simultaneously direct the light to the photodetector and the secondary charged particles to a secondary charged particle detector.

14. The apparatus of claim 1, wherein the reflector is situated to receive a voltage so as to provide a bias that directs the secondary charged particles away from the reflector and CPB axis.

15. The apparatus of claim 14, wherein the reflector is situated to receive different voltages at different portions of the reflector.

16. The apparatus of claim 15, wherein the different portions comprise a first portion and a second portion with the first portion receiving a larger bias than the second portion, wherein the first portion is along a strong curving section adjacent to the sample location and the second voltage is along a weaker curving section adjacent to the sample location.

17. The apparatus of claim 1, further comprising a light source configured to emit a light beam to produce the photon-sample interaction.

18. The apparatus of claim 17, wherein the light emitted from the sample corresponds to a Raman emission.

19. A method, comprising:
  positioning a reflector adjacent to a CPB sample location situated to receive a charged particle beam (CPB) along a CPB axis from a CPB focusing assembly so that the reflector is situated to receive light emitted from the sample at the sample location based on a CPB-sample interaction or a photon-sample interaction and to direct the light to a photodetector; and
  positioning a steering electrode adjacent to the reflector so as to direct secondary charged particles emitted from the sample based on the CPB-sample interaction away from the reflector and CPB axis.

20. The method of claim 19, wherein a length of the reflector includes an extension providing an additional collection angle for the light emitted from the sample and having an extension length at least in part based on the directing of the secondary charged particles with the steering electrode away from the reflector.

21. The method of claim 19, wherein the reflector is a parabolic reflector situated to collimate or focus the light along an optical axis.

22. The method of claim 19, further comprising directing the CPB to the sample;
  detecting the light with the photodetector; and
  detecting the secondary charged particles with a charged particle detector.

23. The method of claim 22, wherein the CPB is an electron beam, the second charged particles are secondary electrons, and the light comprises cathodoluminescence.

24. A system, comprising:
  at least one processor; and
  one or more computer-readable storage media including stored instructions that, responsive to execution by the at least one processor, cause the system to control a-voltage of a steering electrode situated adjacent to a reflector so as to direct secondary charged particles away from the reflector and a charged particle beam (CPB) axis, wherein the second charged particles are emitted from a sample at a sample location based on an interaction between a CPB propagating along a CPB axis and the sample, wherein the reflector is positioned adjacent to the sample location and the sample location is situated to receive the CPB along the CPB axis from a CPB focusing assembly so that the reflector is situated to receive light emitted from the sample based on the CPB-sample interaction or a photon-sample interaction and to direct the light to a photodetector.

* * * * *